United States Patent [19]
Yamada

[11] Patent Number: 6,060,363
[45] Date of Patent: *May 9, 2000

[54] METHOD OF MANUFACTURING SEMICONDUCTOR DEVICE

[75] Inventor: Hiroyuki Yamada, Kanagawa, Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/822,348

[22] Filed: Mar. 20, 1997

[30] Foreign Application Priority Data

Mar. 22, 1996 [JP] Japan ................................ 8-093404

[51] Int. Cl.$^7$ .................................................. H01L 21/336
[52] U.S. Cl. .......................... 438/303; 438/305; 438/279; 438/673; 438/669
[58] Field of Search .................................... 438/303, 305, 438/306, 307, 587, FOR 389, FOR 204, 669, 673; 430/311, 312, 313, 314

[56] References Cited

U.S. PATENT DOCUMENTS

| | | | |
|---|---|---|---|
| 5,213,992 | 5/1993 | Lu ........................................... | 438/398 |
| 5,227,319 | 7/1993 | Ogura et al. ............................ | 438/305 |
| 5,385,857 | 1/1995 | Solo de Zaldivar .................... | 438/305 |
| 5,480,814 | 1/1996 | Wuu et al. .............................. | 438/305 |
| 5,547,900 | 8/1996 | Lin .......................................... | 438/305 |
| 5,558,976 | 9/1996 | Urano et al. ............................ | 430/426 |
| 5,679,499 | 10/1997 | Yamamori ............................... | 430/313 |
| 5,700,739 | 12/1997 | Chiang et al. .......................... | 438/655 |
| 5,719,072 | 2/1998 | Sugiura et al. ......................... | 438/952 |
| 5,783,365 | 7/1998 | Tsujita .................................... | 430/311 |

FOREIGN PATENT DOCUMENTS 4-07-273010 10/1995 Japan .

*Primary Examiner*—Michael Trinh
*Attorney, Agent, or Firm*—Hill & Simpson

[57] ABSTRACT

A silicon dioxide film with a film thickness of 250 to 310 nm is formed on a conductive layer. A resist coated on the silicon dioxide film is exposed with an i-line in a wiring pattern, and developed to form the wiring pattern on the resist. The silicon dioxide film and the conductive layer are simultaneously processed using this resist as a mask. As a result, formation of tails in the resist can be suppressed, while a dielectric breakdown voltage across a conductive layer above the silicon dioxide film and the conductive layer below the silicon dioxide film is ensured, and an increase in step is suppressed. A wiring layer having a desired line width can be formed with high controllability.

6 Claims, 4 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device in which a conductive layer and an SiO2 film on this conductive layer are simultaneously processed into a wiring pattern.

2. Description of the Related Art

FIG. 1 shows a related art of a method of manufacturing a MOS transistor in which a contact hole for the source/drain is formed in self-alignment with the gate electrode. In this related art, after an $SiO_2$ film 12 serving as a gate oxide film is formed on the surface of an Si substrate 11, a polycide film 13 or the like serving as a gate electrode material, and an $SiO_2$ film 14 serving as an offset insulating film are sequentially formed.

A resist 15 is coated on the $SiO_2$ film 14, exposed in a gate electrode pattern with an i-line (wavelength: 365 nm), and then developed. The $SiO_2$ film 14 and the polycide film 13 are simultaneously processed into the gate electrode pattern by etching using the resist 15 as a mask. After the resist 15 is removed, diffusion layers (not shown) for an LDD structure are formed in the Si substrate 11 by ion-implanting an impurity using the $SiO_2$ film 14 and the like as a mask.

Sidewall spacers (not shown) are formed on the polycide film 13 and the $SiO_2$ film 14, and a source and drain (not shown) are formed in the Si substrate 11 by ion-implanting an impurity using the $SiO_2$ film 14, the sidewall spacers, and the like as a mask. An interlayer insulating film (not shown) is formed on the entire surface. Portions of the interlayer insulating film above and near the source and drain where contact holes are to be formed are selectively removed.

The above related art employs a film thickness of about 200 nm for the $SiO_2$ film 14 in order to ensure a dielectric breakdown voltage across a conductive layer (not shown) on the $SiO_2$ film 14 and the interlayer insulating film, and the polycide film 13, and to facilitate subsequent processing by suppressing an increase in step.

If, however, the $SiO_2$ film 14 about 200 nm thick is used as an offset insulating film on the polycide film 13, so-called tails 15a are formed in the resist 15, as shown in FIG. 1. For this reason, it is difficult to form a gate electrode having a desired line width with high controllability.

SUMMARY OF THE INVENTION

According to the present invention, a method of manufacturing a semiconductor device comprises the steps of preparing a substrate, forming a conductive layer on the substrate, forming a silicon dioxide film on the conductive layer to a film thickness of 250 to 310 nm, forming a resist on the silicon dioxide film, exposing the resist with an i-line, patterning the resist, simultaneously processing the conductive layer and the silicon dioxide film into a wiring pattern by using the patterned resist as a mask, forming an interlayer insulating film, and forming a wiring layer.

In the semiconductor device manufacturing method of the present invention, the film thickness of the silicon dioxide film is adjusted to 250 to 310 nm. Formation of tails in the resist exposed with an i-line and developed can be suppressed, while a dielectric breakdown voltage across the conductive layer below this silicon dioxide film and a conductive layer above the silicon dioxide film is ensured, and an increase in step is suppressed. Therefore, a wiring layer having a desired line width can be formed with high controllability by processing the silicon dioxide film and the conductive layer using this resist as a mask.

BRIEF DESCRIPTION OF THE DRAWINGS

FIGS. 1A and 1B show an intermediate step in a related art, in which FIG. 1A is a sectional side view at a position taken along the line A—A in FIG. 1B, and FIG. 1B is a plan view;

FIGS. 2A and 2B show an intermediate step in an embodiment of the present invention, in which FIG. 2A is a sectional side view at a position taken along the line A—A in FIG. 2B, and FIG. 2B is a plan view;

DETAILED DESCRIPTION OF THE PREFERRED EMBODIMENT

An embodiment of the present invention applied to the manufacture of a MOS transistor in which a contact hole for the source/drain is formed in self-alignment with respect to the gate electrode will be described below with reference to FIGS. 2A to 4E.

Figure 1A:
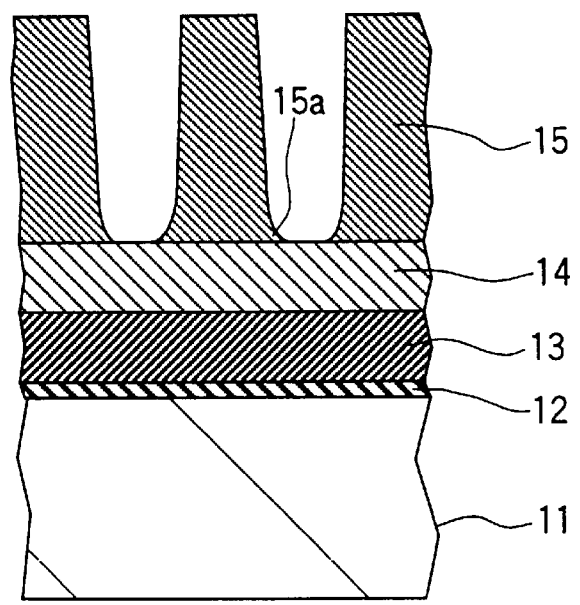
Figure 1B:
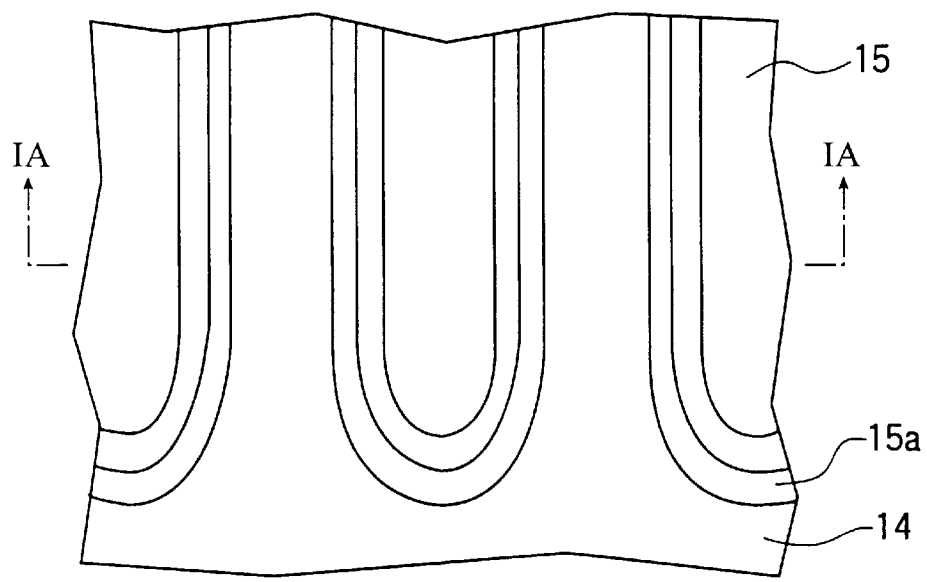
Figure 2A:
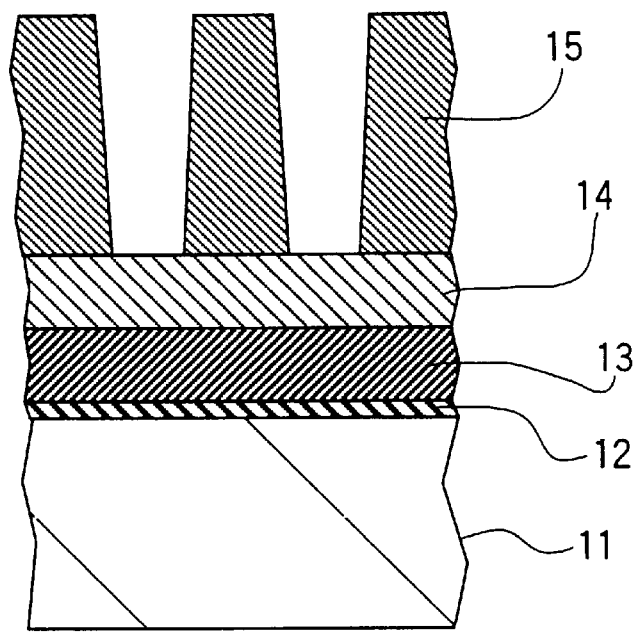
Figure 3A:
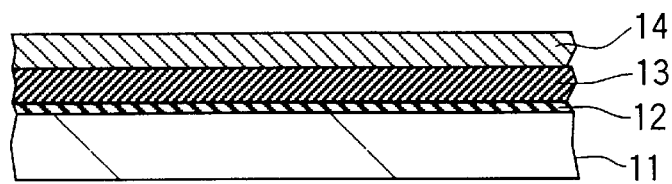
FIGS. 3A to 3E are sectional side views sequentially showing the first half of steps in the embodiment.

In this embodiment, as shown in FIGS. 2A and 3A, after an $SiO_2$ film 12 serving as a gate oxide film is formed on the surface of an Si substrate 11, a polycide film 13 or the like serving as a gate electrode material, and an $SiO_2$ film 14 serving as an offset insulating film are sequentially formed. The film thickness of the $SiO_2$ film 14 is adjusted to 250 to 310 nm.

Figure 2B:
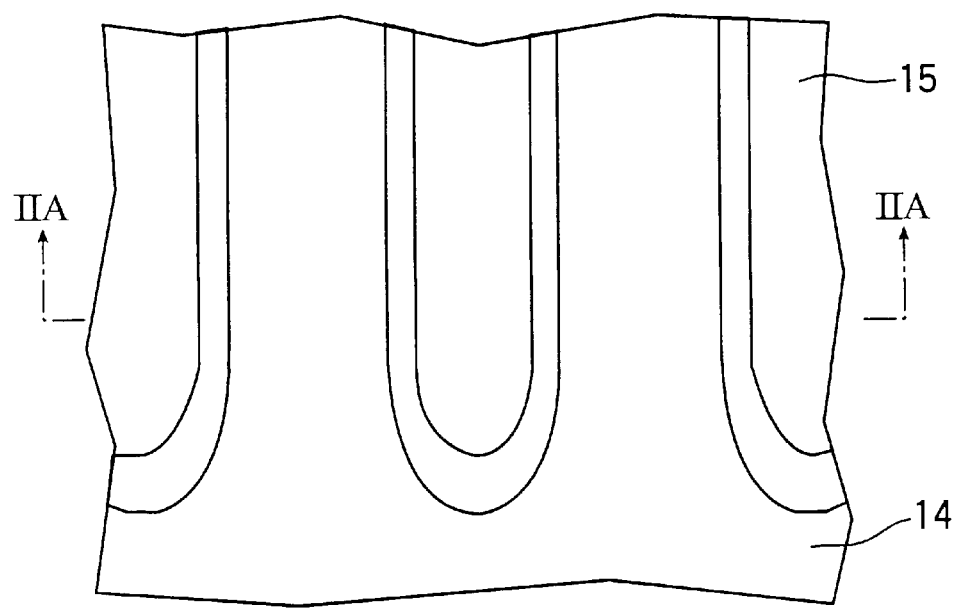
Figure 3B:
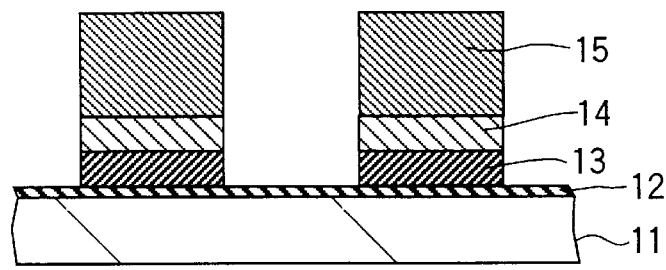

As shown in FIGS. 2A and 3B, a resist 15 is coated on the $SiO_2$ film 14, exposed in a gate electrode pattern with an i-line (wavelength: 365 nm), and then developed. Note that the section of the developed resist 15 is actually tapered, as shown in FIGS. 2A and 2B. In FIG. 3B, however, the section of the resist 15 is rectangular for illustrative convenience.

Figure 3C:
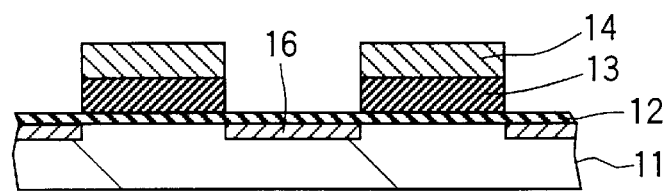

The $SiO_2$ film 14 and the polycide film 13 are simultaneously processed into the gate electrode pattern by etching using the resist 15 as a mask. After the resist 15 is removed, diffusion layers 16 for an LDD structure are formed in the Si substrate 11 by ion-implanting an impurity using the $SiO_2$ film 14 and the like as a mask, as shown in FIG. 3C. Note that it is also possible to etch the $SiO_2$ film 14 using the resist 15 as a mask, and then etch the polycide film 13 using the $SiO_2$ film 14 as a mask.

Figure 3D:
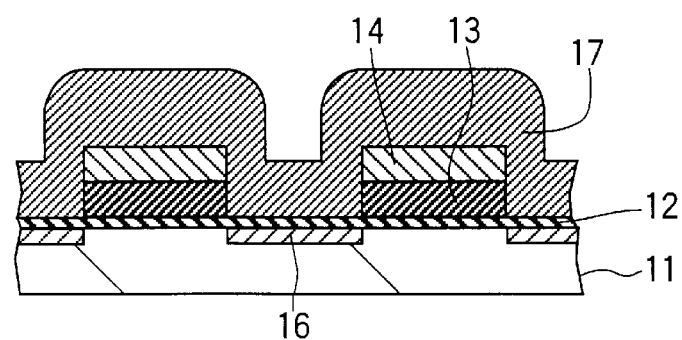
Figure 3E:
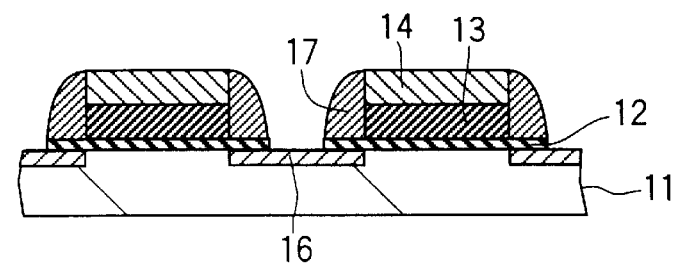

As shown in FIG. 3D, an $SiO_2$ film 17 is deposited on the entire surface by CVD. RIE is performed with respect to the entire surfaces of the $SiO_2$ films 17 and 12, thereby forming sidewall spacers consisting of the $SiO_2$ film 17 on the polycide film 13 and the $SiO_2$ film 14, as shown in FIG. 3E.

Figure 4A:
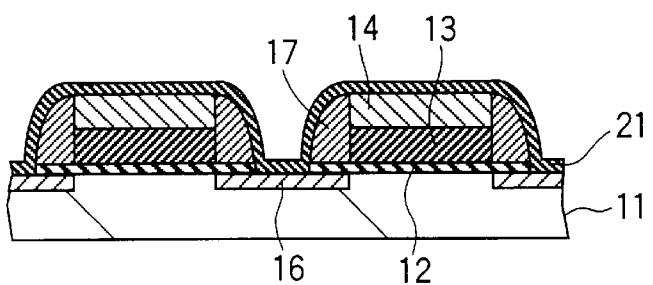
FIGS. 4A to 4E are sectional side views sequentially showing the second half of the steps in the embodiment.
Figure 4B:
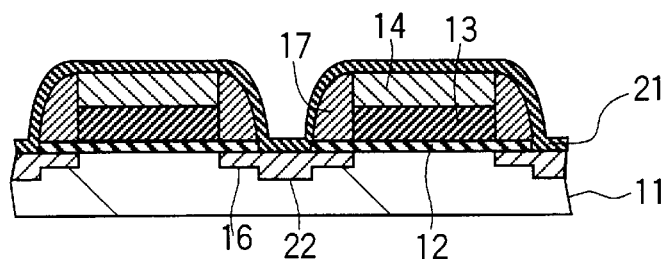

As shown in FIG. 4A, an $SiO_2$ film 21 used as a sacrificial oxide film for preventing channeling, contamination, and the like in ion implantation is deposited on the entire surface by CVD. As shown in FIG. 4B, diffusion layers 22 serving as the source and drain are formed in the Si substrate 11 by ion-implanting an impurity using the $SiO_2$ films 14 and 17 as a mask.

Figure 4C:
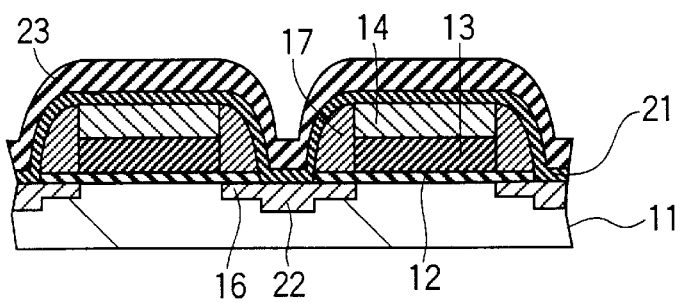
Figure 4D:
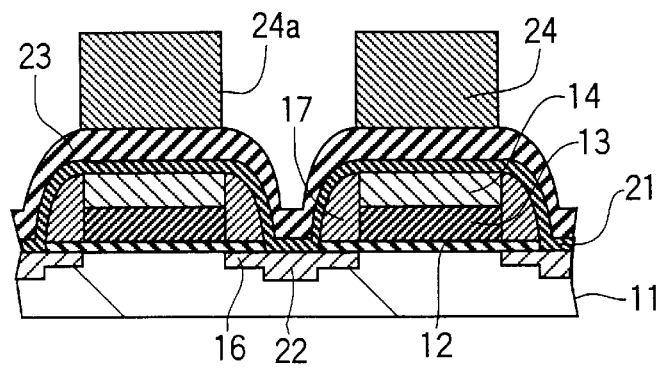
Figure 4E:
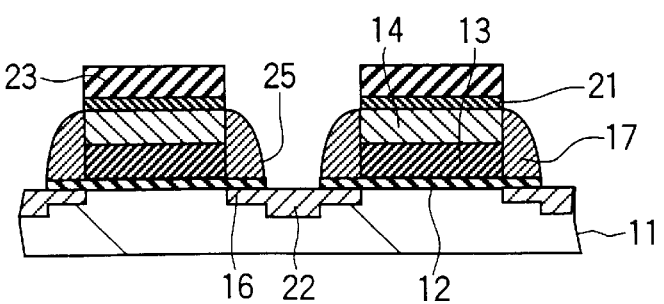

As shown in FIG. 4C, an interlayer insulating film 23 is deposited on the entire surface by CVD. As shown in FIG. 4D, a resist 24 having holes 24a at portions above and near the diffusion layers 22 where contact holes are to be formed is formed on the interlayer insulating film 23. RIE is performed with respect to the interlayer insulating film 23 and the SiO$_2$ film 21 using the resist 24 as a mask, thereby forming contact holes 25 in self-alignment with the polycide film 13, as shown in FIG. 4E.

The following table 1 shows the presence/absence of tails in the resist 15 when the resist 15 using a novolac resin as a base resin is coated on the SiO$_2$ film 14 having one of various film thicknesses, exposed with an i-line (wavelength: 365 nm), developed, and patterned.

TABLE 1

| Film Thickness of SiO$_2$ Film (nm) | Tail |
|---|---|
| 140 | Absent |
| 150 | Absent |
| 190 | Present |
| 220 | Present |
| 240 | Present |
| 250 | Absent |
| 270 | Absent |
| 310 | Absent |

In this embodiment, since the film thickness of the SiO$_2$ film 14 is adjusted to 250 to 310 nm, no tail is formed in the resist 15, as is apparent from FIGS. 2A and 2B and Table 1. On the other hand, since the wavelength of an i-line is 365 nm, and the refractive index (n) of SiO$_2$ is 1.4745, no tail is formed with a film thickness shifted by a period of about 124 nm as 1/(2n) the wavelength of an i-line in SiO$_2$, as is apparent from Table 1.

If, however, the film thickness of the SiO$_2$ film 14 is smaller by about 124 nm than a film thickness of 250 to 310 nm, it becomes difficult to ensure a dielectric breakdown voltage across a conductive layer (not shown) on the SiO$_2$ film 14 and the interlayer insulating film 23, and the polycide film 13. To the contrary, if the film thickness of the SiO$_2$ film 14 is larger by about 124 nm than a film thickness of 250 to 310 nm, the step increases to complicate subsequent processing. Therefore, a film thickness of 250 to 310 nm in this embodiment is most preferable.

In the above embodiment, the present invention is applied to the manufacture of a MOS transistor in which a contact hole for the source/drain is formed in self-alignment with the gate electrode. The present invention can also be applied to the manufacture of a semiconductor device other than the MOS transistor, e.g., a semiconductor device in which a contact hole is formed in self-alignment with a wiring layer, or a semiconductor device in which a field-shield electrode is formed in an isolation region.

What is claimed is:

1. A method of manufacturing a semiconductor device, comprising the steps of:

preparing a substrate;

forming a conductive layer on said substrate;

forming a silicon dioxide film on said conductive layer to a film thickness of 250 to 310 nm;

forming a resist on said silicon dioxide film;

exposing said resist with an I-line;

patterning said resist wherein a section of the resist is tapered in vertical cross section, the taper being constant in the vertical direction;

simultaneously processing said conductive layer and said silicon dioxide film into a wiring pattern by using said patterned resist as a mask.

2. A method according to claim 1, wherein said wiring layer is a gate electrode.

3. A method according to claim 1, wherein said wiring layer is a field-shield electrode.

4. A method of manufacturing a semiconductor device, comprising the steps of:

preparing a substrate;

forming a conductive layer on said substrate;

forming a silicon dioxide film on said conductive layer to a film thickness of 250 to 310 nm;

forming a resist on said silicon dioxide film;

exposing said resist with an i-line;

patterning said resist wherein a section of the resist is tapered in vertical cross section, the taper being constant in the vertical direction;

simultaneously processing said conductive layer and said silicon dioxide film into a pattern of a wiring layer by using said patterned resist as a mask;

doping an impurity in said substrate by using said wiring layer as a mask;

forming an insulating film on said conductive layer and said silicon dioxide film;

forming spacer films of said insulating film on side walls of said conductive layer and said silicon dioxide film;

forming an opening portion to contact a region doped with the impurity in said interlayer insulating film in self-alignment; and filling the opening portion with a conductive film.

5. A method according to claim 4, wherein said wiring layer is a gate electrode.

6. A method according to claim 4, wherein said pattern of a wiring layer is a field-shield electrode.

* * * * *